(12) United States Patent
Kim et al.

(10) Patent No.: US 8,903,337 B2
(45) Date of Patent: *Dec. 2, 2014

(54) MULTI-BAND WIDE BAND POWER AMPLIFIER DIGITAL PREDISTORTION SYSTEM

(71) Applicant: Dali Systems Co. Ltd., Maples Corporate Services Limited, Grand Cayman, KY (US)

(72) Inventors: Wan-Jong Kim, Coquitlam (CA); Kyoung-Joon Cho, Coquitlam (CA); Shawn Patrick Stapleton, Burnaby (CA)

(73) Assignee: Dali Systems Co. Ltd., George Town Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/894,987

(22) Filed: May 15, 2013

(65) Prior Publication Data

US 2013/0251066 A1   Sep. 26, 2013

Related U.S. Application Data

(60) Continuation of application No. 13/705,022, filed on Dec. 4, 2012, now Pat. No. 8,467,747, which is a division of application No. 12/928,934, filed on Dec. 21, 2010, now Pat. No. 8,351,877.

(60) Provisional application No. 61/288,838, filed on Dec. 21, 2009.

(51) Int. Cl.
*H04B 1/04* (2006.01)
*H04L 27/36* (2006.01)
*H03F 1/32* (2006.01)
*H04B 1/62* (2006.01)
*H04L 27/26* (2006.01)

(52) U.S. Cl.
CPC ........ *H04B 1/0475* (2013.01); *H03F 2200/111* (2013.01); *H04L 27/2626* (2013.01); *H04L 27/368* (2013.01); *H03F 1/3247* (2013.01); *H04B 1/62* (2013.01); *H03F 2200/451* (2013.01)
USPC .................. 455/114.3; 455/127.2; 455/550.1; 375/296

(58) Field of Classification Search
CPC ...................................... H04B 1/0475
USPC ................ 455/114.3, 126, 127.1, 127.2, 260, 455/550.1; 375/296, 297, 376
See application file for complete search history.

(56) References Cited

U.S. PATENT DOCUMENTS

| 4,638,248 A | 1/1987 | Schweickert |
| 5,678,198 A | 10/1997 | Lemson |

(Continued)

FOREIGN PATENT DOCUMENTS

| CA | 2616323 | 6/2007 |
| EP | 1746720 | 1/2007 |

(Continued)

*Primary Examiner* — Nhan Le
(74) *Attorney, Agent, or Firm* — Kilpatrick Townsend & Stockton LLP

(57) ABSTRACT

A high performance and cost effective method of RF-digital hybrid mode power amplifier systems with high linearity and high efficiency for multi-frequency band wideband communication system applications is disclosed. The present disclosure enables a power amplifier system to be field reconfigurable and support multiple operating frequency bands on the same PA system over a very wide bandwidth. In addition, the present invention supports multi-modulation schemes (modulation agnostic), multi-carriers and multi-channels.

20 Claims, 7 Drawing Sheets

Digital Predistortion Block Diagram

(56) References Cited

U.S. PATENT DOCUMENTS

| | | | |
|---|---|---|---|
| 5,757,229 | A | 5/1998 | Mitzlaff |
| 6,246,286 | B1 | 6/2001 | Persson |
| 6,301,579 | B1 | 10/2001 | Becker |
| 6,424,225 | B1 | 7/2002 | Choi et al. |
| 6,625,429 | B1 | 9/2003 | Yamashita |
| 6,747,649 | B1 | 6/2004 | Sanz-Pastor |
| 6,751,447 | B1 | 6/2004 | Jin et al. |
| 7,102,442 | B2 | 9/2006 | Anderson |
| 7,109,998 | B2 | 9/2006 | Smith |
| 7,362,125 | B2 | 4/2008 | Gupta et al. |
| 7,372,918 | B2 | 5/2008 | Muller et al. |
| 7,535,298 | B2 | 5/2009 | Sihlbom et al. |
| 7,542,518 | B2 | 6/2009 | Kim et al. |
| 7,583,754 | B2 | 9/2009 | Liu |
| 7,593,450 | B2 | 9/2009 | Conyers et al. |
| 7,606,324 | B2 | 10/2009 | Cai et al. |
| 7,634,238 | B2 | 12/2009 | Suzuki et al. |
| 7,817,962 | B2 | 10/2010 | Zolfaghari |
| RE42,287 | E | 4/2011 | Apodaca et al. |
| 8,095,094 | B2 | 1/2012 | Matsui et al. |
| 8,295,789 | B2 | 10/2012 | Suzuki et al. |
| 8,351,877 | B2 * | 1/2013 | Kim et al. .................. 455/114.3 |
| 8,355,682 | B2 | 1/2013 | Kenington |
| 8,620,233 | B2 * | 12/2013 | Brobston .................. 455/114.3 |
| 2003/0179829 | A1 | 9/2003 | Pinckley et al. |
| 2004/0240585 | A1 * | 12/2004 | Bishop et al. .................. 375/297 |
| 2005/0017801 | A1 | 1/2005 | Bachman et al. |
| 2005/0062531 | A1 | 3/2005 | Schreyer et al. |
| 2005/0079834 | A1 | 4/2005 | Maniwa et al. |
| 2005/0262498 | A1 | 11/2005 | Ferguson et al. |
| 2006/0012426 | A1 | 1/2006 | Nezami |
| 2006/0270366 | A1 | 11/2006 | Rozenblit et al. |
| 2007/0075780 | A1 | 4/2007 | Krvavac et al. |
| 2007/0171234 | A1 | 7/2007 | Crawfis et al. |
| 2007/0241812 | A1 | 10/2007 | Yang et al. |
| 2008/0146168 | A1 | 6/2008 | Jesson et al. |
| 2009/0146736 | A1 | 6/2009 | Kim et al. |
| 2009/0163156 | A1 | 6/2009 | Rofougaran et al. |
| 2009/0232191 | A1 | 9/2009 | Gupta et al. |

FOREIGN PATENT DOCUMENTS

| | | |
|---|---|---|
| WO | 0108297 | 2/2001 |
| WO | 2008154077 | 12/2008 |

* cited by examiner

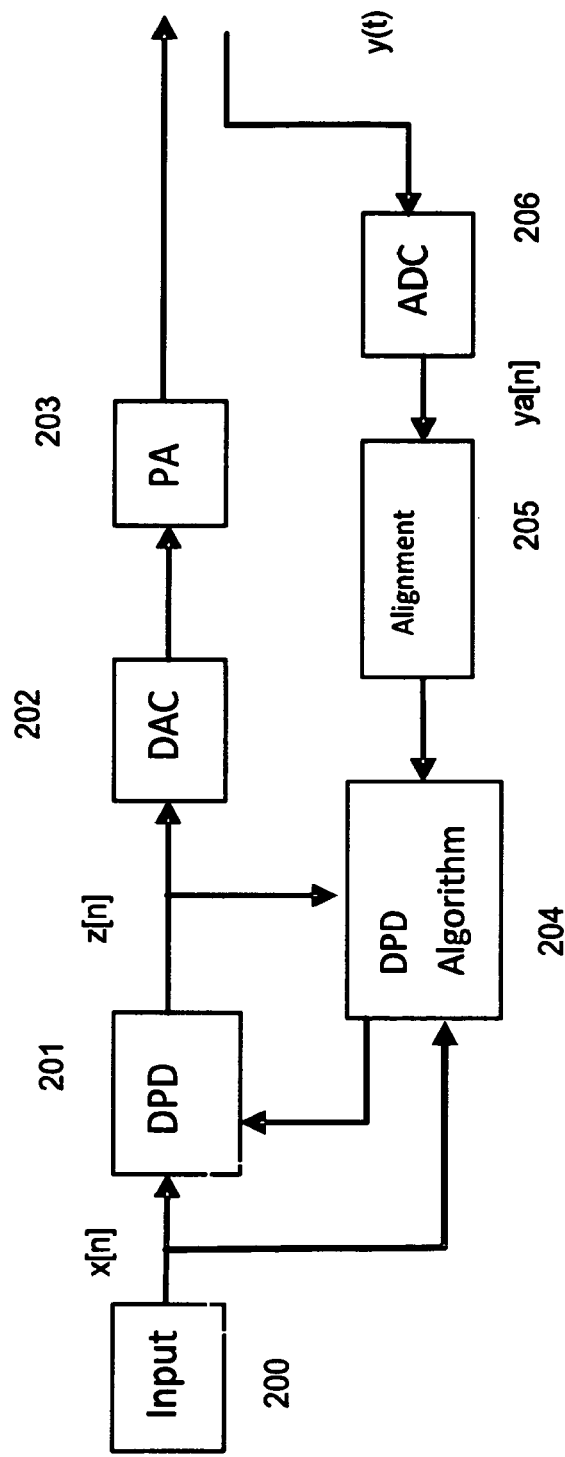
FIG. 2. Digital Predistortion Block Diagram

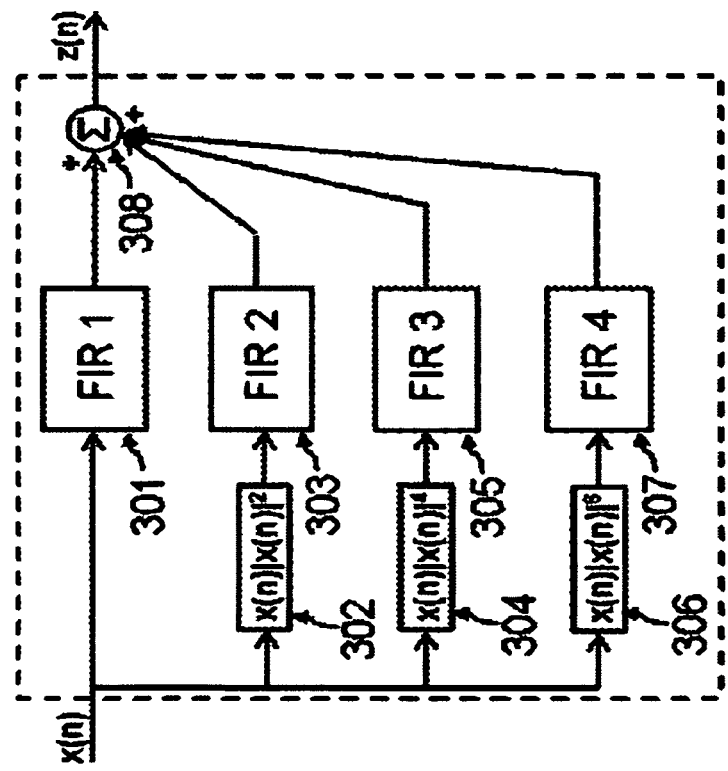
FIG. 3. Polynomial based Predistorter

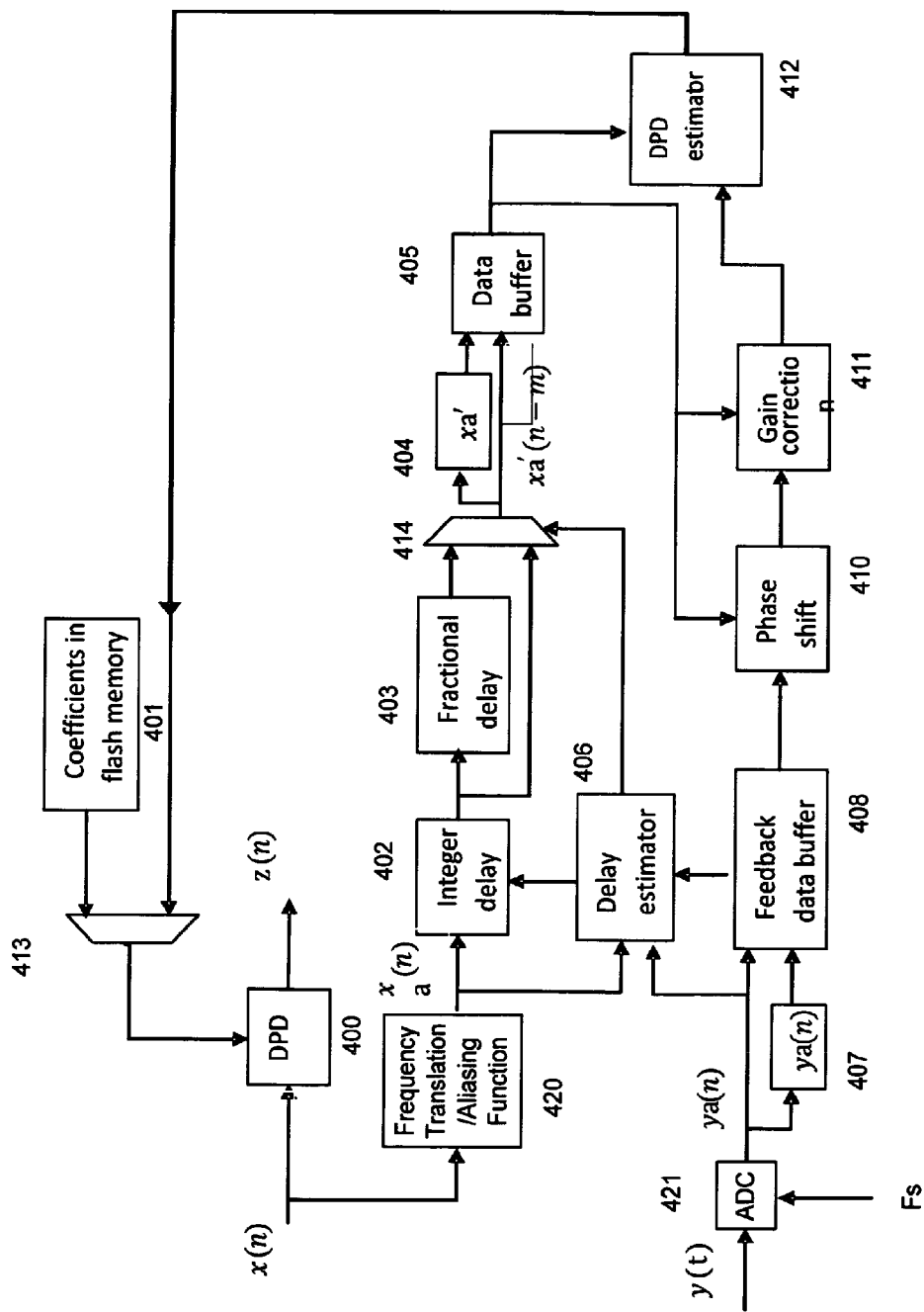
FIG. 4. Digital Predistortion Direct Learning Algorithm

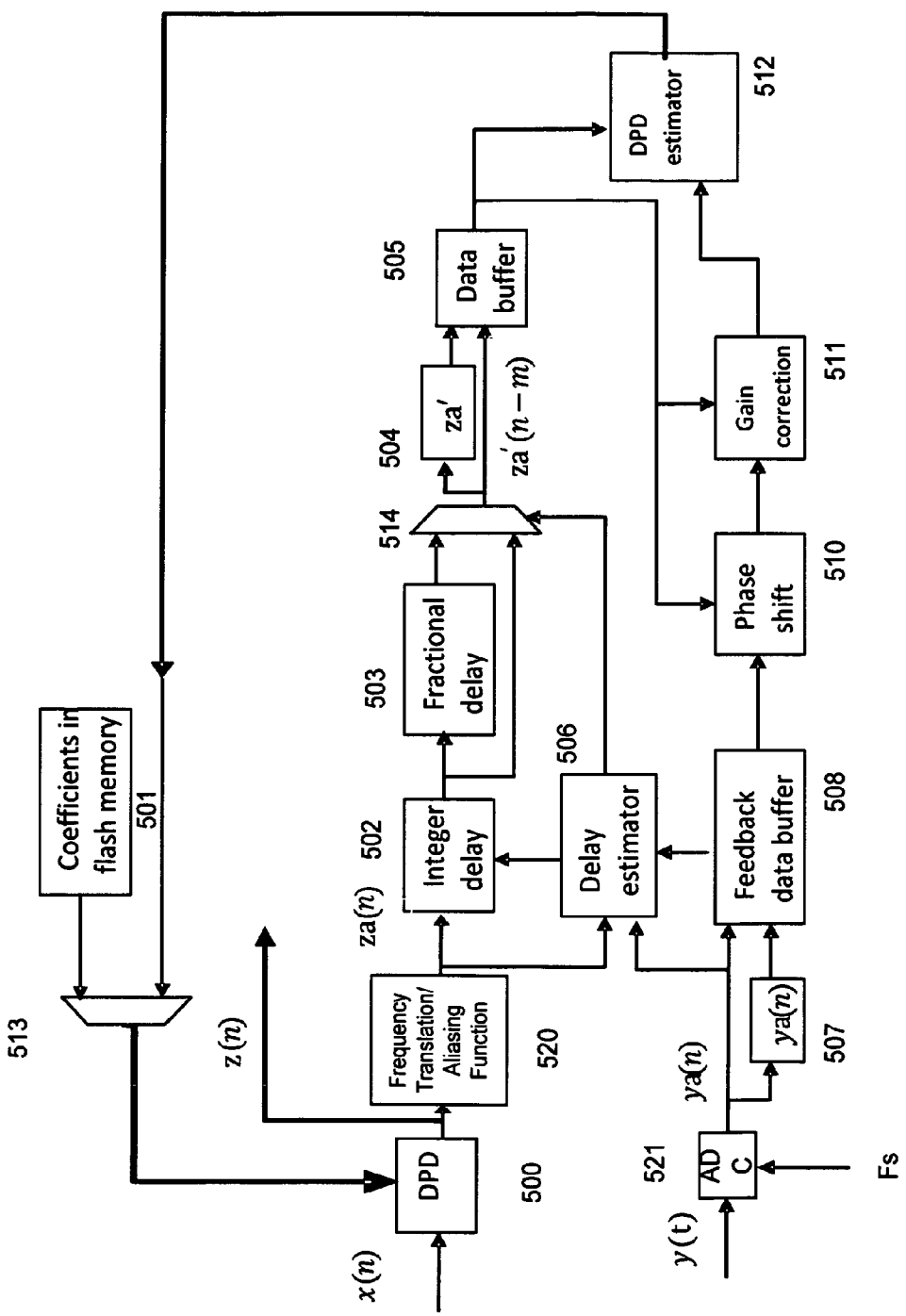
FIG. 5. Digital Predistortion Indirect Learning Algorithm

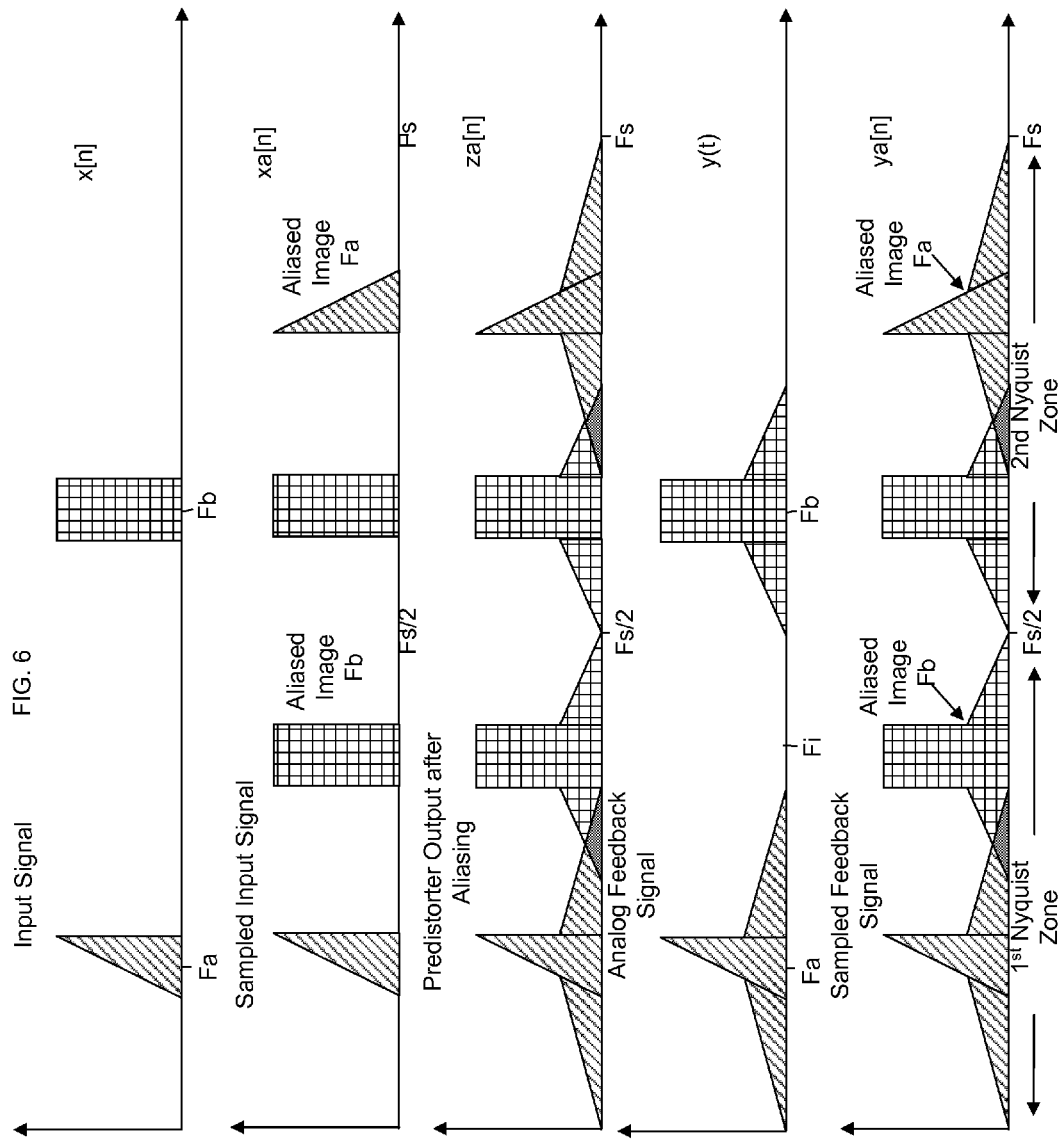

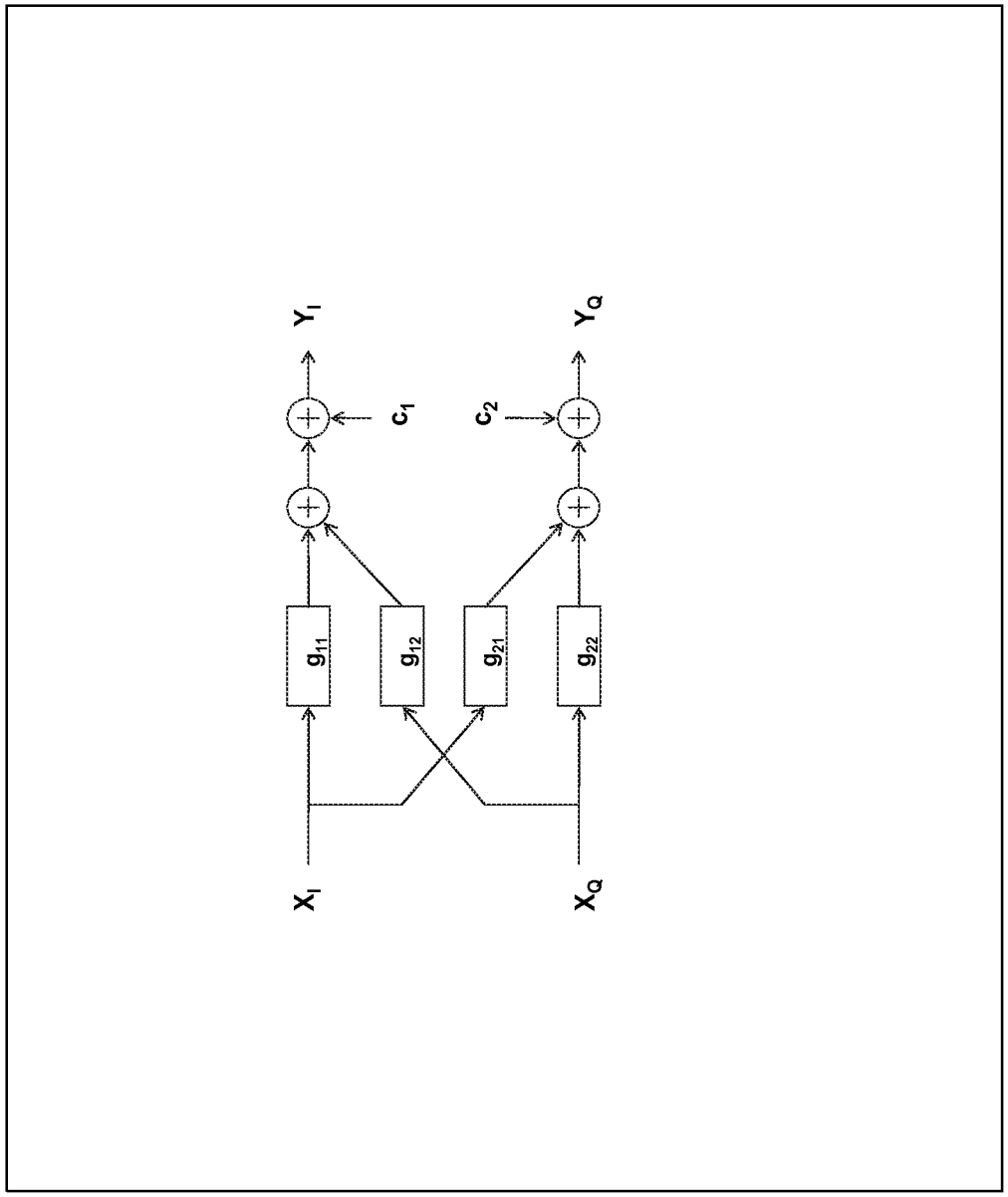
FIG. 7 Analog Quadrature Modulator Compensation Block

MULTI-BAND WIDE BAND POWER AMPLIFIER DIGITAL PREDISTORTION SYSTEM

RELATED APPLICATIONS

This application is a continuation of Ser. No. 13/705,022 filed Dec. 4, 2012, which is a divisional of U.S. application Ser. No. 12/928,934, filed Dec. 21, 2010, now U.S. Pat. No. 8,351,877, which is a non-provisional of and claims the benefit of U.S. Patent Application Ser. No. 61/288,838, filed Dec. 21, 2009. Each of these applications is hereby incorporated by reference for all purposes.

FIELD OF THE INVENTION

The present invention generally relates to wireless communication systems using complex modulation techniques. More specifically, the present invention relates to power amplifier systems for wireless communications.

BACKGROUND OF THE INVENTION

A wideband mobile communication system using complex•modulation techniques, such as wideband code division access (WCDMA) and orthogonal frequency division multiplexing (OFDM), has large peak-to-average power ratio (PAPR) specifications and hence requires highly linear power amplifiers for its RF transmissions. Conventional digital predistortion (DPD) techniques have an operational bandwidth limitation.

Conventional DSP-based DPD schemes utilize FPGAs, DSPs or microprocessors to compute, calculate and correct the PA's nonlinearities: they perform fast tracking and adjustments of signals in the PA system. However, conventional DSP-based DPD schemes are challenged by variations of the linearity performance of the power amplifier over wide bandwidths due to the environment changing such as temperature and the asymmetric distortions of the output signal of the PA resulting from memory effects. Conventional DPD algorithms are based on a wideband feedback signal, they require a high speed analog-to-digital converter (ADC) in order to capture the necessary information. Multi-frequency band, or simply multi-band, applications can have their operating frequencies spaced significantly apart. Conventional DPD architectures use an ADC sampling rate that is greater than twice the nonlinear distortion bandwidth of the input signal. This sampling rate is typically more than double a factor of five times the operating bandwidth of the complex modulated signal. The factor of five accounts for the spectral regrowth attributed to the nonlinear distortion created by the power amplifier. This restriction on sampling rate, limits the feasibility of the conventional predistortion architectures to single band applications. Higher sampling rate ADCs have lower resolution, consume more power and are more expensive.

SUMMARY OF THE INVENTION

Accordingly, the present invention has been made in view of the above problems, and it is an object of the present invention to provide a high performance and cost effective method of power amplifier systems with high linearity and high efficiency for multi-frequency band wideband communication system applications. The present disclosure enables a power amplifier system to be field reconfigurable and support multiple operating frequency bands on the same PA system over a very wide bandwidth. In addition, the present invention supports multi-modulation schemes (modulation agnostic), multi-carriers, and multi-channels.

To achieve the above objects, according to the present invention, the technique is based on the method of adaptive digital predistortion to linearize a RF power amplifier. The present invention is based on using distinct signals from different frequencies (Multi-Band Signals). These Multi-Band Signals will experience distortion by the power amplifier and create nonlinear distortion centered on each carrier that is approximately five times their individual bandwidths. The feedback signal from the power amplifier's are down converted to an intermediate frequency (IF) that insures that the fundamental carrier bandwidths will not be aliased onto each other after sampling in the ADC. The present invention can accommodate aliasing of the nonlinear distortion of the individual carriers.

Various embodiments of the invention are disclosed. In an embodiment, the combination of crest factor reduction (CFR), DPD, power efficiency boosting techniques as well as coefficient adaptive algorithms are utilized within a PA system. In another embodiment, analog quadrature modulator (AQM) compensation structure is also utilized to enhance performance.

Some embodiments of the present invention are able to monitor the fluctuation of the power amplifier characteristics and to self-adjust by means of a self-adaptation algorithm. One such self-adaptation algorithm, presently disclosed is called an adaptive DPD algorithm, which is implemented in the digital domain and taught in the applications incorporated herein by reference and attached as an Appendix.

Applications of the present invention are suitable for use with all wireless base-stations, access points, mobile equipment and wireless terminals, portable wireless devices, and other wireless communication systems such as microwave and satellite communications.

THE FIGURES

Further objects and advantages of the present invention can be more fully understood from the following detailed description taken in conjunction with the accompanying drawings in which:

FIG. 2 is a block diagram showing a simple digital predistortion block diagram for a power amplifier system according to one embodiment of the present invention.

FIG. 3 is a block diagram showing polynomial based predistorter of the present invention.

FIG. 4 is a block diagram of the digital predistortion Direct Learning algorithm applied for self-adaptation in a digital predistortion•power amplifier system of the present invention.

FIG. 5 is a block diagram of the digital predistortion In-direct Learning algorithm applied for self-adaptation in a digital predistortion power amplifier system of the present invention.

FIG. 6 is a depiction of the frequency domain signals present in the aliased digital predistortion system.

FIG. 7 is an embodiment of the Quadrature Modulator compensation block architecture.

GLOSSARY OF TERMS

Figure 1:
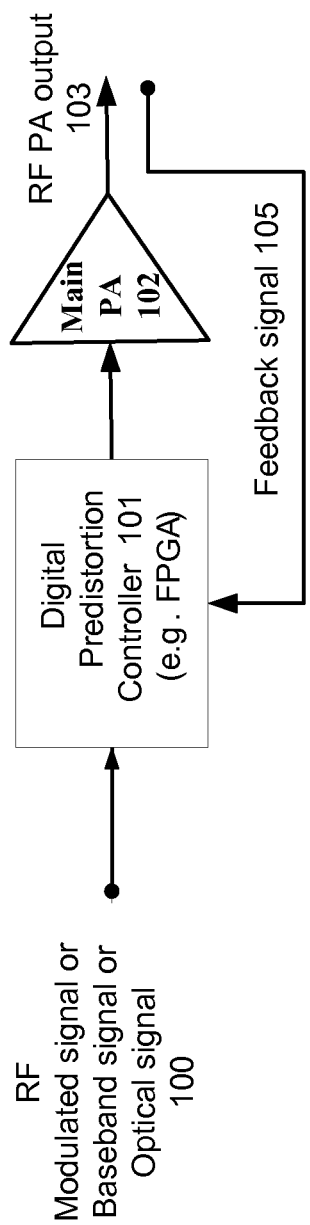
FIG. 1 is a block diagram showing the basic form of a digital predistortion power amplifier system.

ACLR Adjacent Channel Leakage Ratio
ACPR Adjacent Channel Power Ratio
!!'

ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
CDMA Code Division Multiple Access
CFR Crest Factor Reduction
DAC Digital to Analog Converter
DET Detector
DHMPA Digital Hybrid Mode Power Amplifier
DOC Digital Down Converter
DNC Down Converter
DPA Doherty Power Amplifier
DPD Digital Predistortion
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LING Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Predistortion
PLL Phase Locked Loop
QAM Quadrature Amplitude Modulation
QPSK Quadrature Phase Shift Keying
RF Radio Frequency
SAW Surface Acoustic Wave Filter
UMTS Universal Mobile Telecommunications System
UPC Up Converter
WCDMA Wideband Code Division Multiple Access
WLAN Wireless Local Area Network

DETAILED DESCRIPTION OF THE INVENTION

The present invention is a novel multi-band predistortion system that utilizes an adaptive digital predistortion algorithm. The present invention is a hybrid system of digital and analog modules. The interplay of the digital and analog modules of the hybrid system both linearize the spectral regrowth and enhance the power efficiency of the PA while maintaining or increasing the wide bandwidth. The present invention, therefore, achieves higher efficiency and higher linearity for wideband complex modulation carriers that operate simultaneously over multiple, distinct frequency bands.

FIG. 1 is a high level block diagram showing the basic system architecture which can be thought of, at least for some embodiments, as comprising digital and analog modules and a feedback path. The digital module is the digital predistortion controller 101 which comprises the DPD algorithm, other auxiliary DSP algorithms, and related digital circuitries. The analog module is the main power amplifier 102, other auxiliary analog circuitries such as DPA, and related peripheral analog circuitries of the overall system, as further discussed in the applications incorporated by reference. The present invention is a "black box", plug-and-play type system because it accepts RF modulated signal 100 as its input, and provides a substantially identical but amplified RF signal 103 as its output, therefore, it is RF-in/RF-out. Baseband input signals can be applied directly to the Digital Predistorter Controller according to one embodiment of the present invention. An Optical input signal can be applied directly to the Digital Predistorter Controller according to one embodiment of the present invention. The feedback path essentially provides a representation of the output signal to the predistortion controller 101.

In either input mode, the memory effects due to self-heating, bias networks, and frequency dependencies of the active device are compensated by the adaptation algorithm 204 in the DPD 201, FIG. 2. In FIG. 2, the multi-band RF input x[n] is provided to a DPD 201 and to DPD Algorithm logic 204. The output of the DPD 201, z[n] is provided to a DAC 202 and the logic 204. The output of the DAC 202 provides the input to the power amplifier 203. The distortion characteristic of the PA is sensed by the feedback samples y(t), which are converted in the ADC 206 into data ya[n] and provided to alignment logic 205. After alignment the data ya[n] provides feedback data to the algorithm logic 204.

The coefficients of the DPD are adapted by synchronizing the wideband captured, aliased output Multi-Band Signal ya[n] from the feedback path (Sampled Feedback Aliased Signal) with the reference Multi-Band Signal x[n] (Input Signal). The DPD algorithm performs the synchronization and compensation. The synchronization aligns the reference signal with the aliased feedback signal in the alignment block. In one embodiment of the DPD algorithm, the reference signal and the aliased Sampled Feedback Aliased Signal ya[n] are used in the Direct Learning adaptive algorithm. In another embodiment of the DPD algorithm, the aliased predistorted signal za[n] (Predistorted Output Aliased Signal) and the Sampled Feedback Aliased Signal ya[n] are used in an Indirect Learning adaptive algorithm.

Some embodiments apply crest factor reduction (CFR) prior to the DPD with an adaptation algorithm in one digital processor, so as to reduce the PAPR, EVM and ACPR and compensate the memory effects and variation of the linearity due to the temperature changing of the PA. The digital processor can take nearly any form for convenience, an FPGA implementation is typically used, but a general purpose processor is also acceptable in many embodiments. The CFR implemented in the digital module of the embodiments is based on the scaled iterative pulse cancellation presented in patent application U.S. 61/041,164, filed Mar. 31, 2008, entitled An Efficient Peak Cancellation Method For Reducing The Peak-To-Average Power Ratio In Wideband Communication Systems, incorporated herein by reference. The CFR is included to enhance performance and hence optional. The CFR can be removed from the embodiments without affecting the overall functionality.

In all embodiments, the memory effects due to self-heating, bias networks, and frequency dependencies of the active device are compensated by the adaptation algorithm in the DPD. The coefficients of the DPD are adapted by synchronizing the wideband captured output signal from the feedback path with the reference signal. The digital predistortion algorithm performs the synchronization and compensation. The predistorted signal is passed through a DQM in order to generate the real signal and then converted to an IF analog signal via a DAC. The DQM is not required to be implemented in the FPGA, or at all, in all embodiments. If the DQM is not used in the FPGA, then the AQM Implementation can be implemented with two DACs to generate real and imaginary signals, respectively.

FIG. 3. is a block diagram showing a predistortion (PD) part in the DPD system of the present invention. The PD in the present invention generally utilizes an adaptive polynomial-based digital predistortion system. Another embodiment of the PD utilizes a LUT-based digital predistortion system. More specifically, the PD illustrated in FIG. 3 are processed in the digital processor by an adaptive algorithm, presented in U.S. patent application Ser. No. 11/961,969, entitled A Method for Baseband•Predistortion Linearization in Multi-Channel Wideband Communication Systems. The PD for the PD system in FIG. 3. has multiple finite impulse response (FIR) filters, that is, FIR1 301, FIR2 303, FIR3 305, and FIR4 307. The PD also contains the third order product generation block 302, the fifth order product generation block 304, and the seventh order product generation block 306. The output signals from FIR filters are combined in the summation block 308. Coefficients for multiple FIR filters are updated by the digital predistortion algorithm.

Digital Predistorter Algorithm

Digital Predistortion (DPD) is a technique to linearize a power amplifier (PA). FIG. 2 shows the block diagram of a digitally predistorted PA system. In the DPD block, a memory polynomial model is used as the predistortion function (FIG. 3).

$$z(n) = \sum_{i=0}^{n-1} x_i(n-i) \left( \sum_{j=0}^{k-1} a_{ij} |x_i(n-i)|^j \right)$$

where $a_{ij}$ are the DPD coefficients.

In the DPD estimator block, a least square algorithm is utilized to find the DPD coefficients $a_{ij}$, and then transfer them to DPD block. The detailed DPD algorithm is shown in FIG. 4 and FIG. 5. The coefficients are obtained using the QR RLS adaptive algorithm in the DPD estimator block.

FIG. 4 shows one embodiment of the multi-band digital predistorter. The Direct Learning adaptive algorithm has two inputs into the DPD estimator. The DPD estimator uses the aliased sampled Multi-Band Signal xa[n] (Sampled Input Aliased Signal) as a reference and the Sampled Feedback Aliased Signal ya[n] as an input. Thus the x(n) signal is provided to DPD 400 and also frequency translation/aliasing logic 420. The DPD outputs signal z(n), while the aliasing logic 420 outputs•xa(n) and provides it to integer delay logic 402 which then supplies a signal to fractional delay logic 402 and mux 414, which also receives the output of the logic 402. The mux also receives a control signal from delay estimator 406, and provides an output to block xa' 404, which determines xa' (n−m). The mux output is also supplied to data buffer 405, which provides its output to DPD estimator 412, and control signals to phase shift block 41 and gain correction block 411. The feedback signal y(t) is provided to ADC 421, also with sampling frequency $F_s$, which is selected to create appropriate Nyquist zones for the aliased signals. The ADC output is provided to feedback data buffer 408, as is ya(n) data from block 407. The data buffer 408 provides data to delay estimator 406 as well as providing the data to phase shifter 410 and gain correction block 411. The gain correction is supplied to the DPD estimator, which, together with the predistortion coefficients already in memory, shown at 401, are muxed back to DPD 400.

FIG. 5 shows another embodiment of the multi-band digital predistorter. The in-direct Learning adaptive algorithm of FIG. 5 has two inputs into the DPD estimator. The DPD estimator uses the Predistorted Output Aliased Signal za[n] as a reference and the Sampled Feedback Aliased Signal ya[n] as an input, but is otherwise very similar to FIG. 4 and therefore is not explained further.

A depiction of the spectrum domain plots are shown in FIG. 6. The reference Input Signal x[n] shows two distinct bands centered at frequencies $F_a$ and $F_b$. The operating bandwidth of the individual carriers is small in comparison to the frequency spacing between the carriers. The nonlinearities in the power amplifier will cause spectral re-growth as shown in the analog feedback Multi-Band Signal y(t) (Analog Feedback Signal). The Analog Feedback Signal is down converted to an intermediate frequency $F_i$ which is selected to be in the 1st Nyquist zone as shown in FIG. 6. The choice of frequency $F_i$ is dependent on the ADC sampling rate used, or $F_s$, the operating bandwidth of the carriers and the frequency separation ($F_a$-$F_b$) between the carriers. The ADC sampling rate $F_s$ is typically the limiting factor in the choice of F. For a two carrier system $F_a$ is positioned in the 1st Nyquist zone and $F_b$ is positioned in the 2nd Nyquist zone in at least some embodiments, although either signal $F_a$ or $F_b$ could be positioned in the third, fourth or nth Nyquist zones, depending upon the particular implementation. The primary requirement is simply that the two signal are located in different Nyquist zones. The choice of $F_i$ limits how close $F_a$ and $F_b$ can be separated together.

Sampling on the Analog Feedback Signal y(t) generates images as shown in the spectrum for the Sampled Feedback Aliased Signal ya[n]. The nonlinear distortion from the individual carriers are allowed to alias onto each other as long as the aliased part of the signal does not adversely impact the original Multi-Band signal. A Direct Learning algorithm uses the difference between xa[n] and ya[n] to minimize the resultant error signal. The QR RLS algorithm uses this error to adapt the predistorter coefficients in the DPD estimator. The In-Direct learning algorithm first models the power amplifier using the Predistorted Output Aliased Signal za[n] and the Sampled Feedback Aliased Signal ya[n]. The modelled power amplifier coefficients are then used to calculate the predistorter coefficients.

FIG. 7. is a block diagram showing the analog quadrature modulator compensation structure. The analog quadrature modulator will translate the baseband signal output from the DACs to an RF frequency. The input signal is separated into an in-phase component $X_i$ and a quadrature component $X_Q$. The analog quadrature modulator compensation structure comprises four real filters {g11, g12, g21, g22} and two DC offset compensation parameters c1, c2. The DC offsets in the AQM will be compensated by the parameters c1, c2. The frequency dependence of the AQM will be compensated by the filters {g11, g12, g21, g22}. The order of the real filters is dependent on the level of compensation required. The output signals $Y_1$ and •$Y_a$ will be presented to the AQM's in-phase and quadrature ports.

In summary, the multi-band wideband power amplifier predistortion system of the present invention can significantly reduce the feedback ADC sampling rate requirements. This will enable multi-band wideband applications and reduce the power consumption and cost. The system is also reconfigurable and field-programmable since the algorithms and power efficiency enhancing features can be adjusted like software in the digital processor at anytime, as discussed in greater detail in the applications incorporated by reference and attached as an Appendix.

Moreover, the multi-band wideband DPD system is agnostic to modulation schemes such as QPSK, QAM, OFDM, etc. in CDMA, GSM, WCDMA, CDMA2000, and wireless LAN systems. This means that the DPD system is capable of supporting multi-modulation schemes, multi-carriers and multi-channels. Other benefits of the DPD system includes correction of PA non-linearities in repeater or indoor coverage systems that do not have the necessary baseband signals information readily available.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A digital predistortion system comprising:
   a multi-band input signal;
   at least one power amplifier for providing an amplified output including a distortion characteristic;
   a feedback signal derived from the amplified output, the feedback signal including a representation of at least a portion of the distortion characteristic; and
   predistortion logic responsive to an aliased representation of the feedback signal for generating predistortion coefficients for linearizing the amplified output of the power amplifier, wherein a sampling rate of the aliased representation of the feedback signal is less than twice a maximum bandwidth of the feedback signal.

2. The digital predistortion system of claim 1 wherein the sampling rate of the feedback signal is less than a sampling rate of the multi-band input signal.

3. The digital predistortion system of claim 1 wherein the predistortion logic is responsive to a sampled representation of the multi-band input signal.

4. The digital predistortion system of claim 1 further comprising a digital predistorter that receives the multi-band input signal, the digital predistorter effecting the predistortion coefficients derived by the predistortion logic.

5. The digital predistortion system of claim 1 wherein the digital predistorter utilizes an adaptive polynomial-based digital predistortion system, the polynomial-based digital predistortion system utilizing the predistortion coefficients generated by the predistortion logic.

6. The digital predistortion system of claim 5 wherein the digital predistorter utilizes a look-up-table-based digital predistortion system with finite impulse response filters, wherein coefficients for the finite impulse response filters comprise the predistortion coefficients generated by the predistortion logic.

7. The digital predistortion system of claim 1 further comprising alignment logic that aligns the feedback signal relative to the RF input signal.

8. The digital predistortion system of claim 1 wherein the aliased representation of the feedback signal has a frequency in a Nyquist zone.

9. The digital predistortion system of claim 1 wherein the predistortion coefficients are derived using a Direct Learning adaptive algorithm.

10. The digital predistortion system of claim 1 wherein the predistortion coefficients are derived using an Indirect Learning adaptive algorithm.

11. The digital predistortion system of claim 1 wherein the predistortion coefficients are derived to account for memory effects due to one or more of self-heating, bias networks and frequency dependencies of active devices in the digital predistortion system.

12. A method for amplifying signals, the method comprising:
   receiving an RF input signal;
   detecting an amplified output from a power amplifier, the output being responsive to the RF signal and including a distortion characteristic;
   deriving a feedback signal from the amplified output, the feedback signal including a representation of at least a portion of the distortion characteristic; and
   generating, via predistortion logic responsive to an aliased representation of the feedback signal, predistortion coefficients for linearizing the amplified output of the power amplifier, wherein a sampling rate of the aliased representation of the feedback signal is less than twice a maximum bandwidth of the feedback signal.

13. The method of claim 12 wherein the sampling rate of the feedback signal is less than a sampling rate of the RF input signal.

14. The method of claim 12 wherein the predistortion logic is responsive to a sampled representation of the RF input signal.

15. The method of claim 12 further comprising:
   receiving a second RF input signal; and
   predistorting, using a digital predistortor, the second RF input signal using the predistortion coefficients derived by the predistortion logic.

16. The method of claim 12 wherein predistorting the second RF input signal comprises utilizing an adaptive polynomial-based digital predistortion system, the polynomial-based digital predistortion system utilizing the predistortion coefficients derived by the predistortion logic.

17. The method of claim 12 further comprising aligning the feedback signal relative to the RF input signal.

18. The method of claim 12 wherein the aliased representation of the input signal has a frequency in a Nyquist zone.

19. The method of claim 12 wherein the predistortion coefficients are derived using an Direct Learning adaptive algorithm.

20. The method of claim 12 wherein the predistortion coefficients are derived using an Indirect Learning adaptive algorithm.

* * * * *